United States Patent [19]

Shirota

[11] Patent Number: 5,488,006
[45] Date of Patent: Jan. 30, 1996

[54] ONE-CHIP MICROCOMPUTER MANUFACTURING METHOD

[75] Inventor: Shozo Shirota, Itami, Japan

[73] Assignee: Mitsubishi Denki Kabushiki Kaisha, Japan

[21] Appl. No.: 10,501

[22] Filed: Jan. 28, 1993

Related U.S. Application Data

[63] Continuation of Ser. No. 585,539, Sep. 20, 1990, abandoned.

[51] Int. Cl.$^6$ .................. H01L 21/266; H01L 21/8247
[52] U.S. Cl. .................. 437/43; 437/48; 437/52; 365/205; 365/208; 365/185.21
[58] Field of Search ............... 437/43, 48, 52; 365/185, 205, 208; 364/925.6

[56] References Cited

U.S. PATENT DOCUMENTS

| | | | |
|---|---|---|---|
| 4,683,640 | 8/1987 | Faraoue | 437/52 |
| 4,802,119 | 1/1989 | Heene et al. | 364/900 |
| 4,935,791 | 6/1990 | Namaki et al. | 357/23.5 |

FOREIGN PATENT DOCUMENTS

| | | | |
|---|---|---|---|
| 0040495 | 11/1981 | European Pat. Off. | 365/104 |
| 0151476 | 8/1985 | European Pat. Off. | |
| 0436475 | 7/1991 | European Pat. Off. | |

OTHER PUBLICATIONS

"Microcontroller fur Prozessteuerungen," V. Timm (Elektronik 11/27.5, 1988) pp. 117–122.
"Mit einem EEPROM an Bord," V. Timm (Elektronik 22/28.10, 1989) pp. 204–208.
"On Chip EEPROM gives CMOS & SPIC Flexibilty," Bursky, Electronic Design, May 14, 1987, pp. 55, 56, 58.
Electronic Journal, Racino et al, 17/89, pp. 32–34, 36.
"Very Large–Scale Integration (VLSI) Fundamentals and Applications," Ed. Barbe, Springer-Verlag, 1982, pp. 269, 270.

Primary Examiner—Olik Chaudhuri
Assistant Examiner—Richard A. Booth
Attorney, Agent, or Firm—Townsend and Townsend and Crew

[57] ABSTRACT

A method of manufacturing a one-chip microcomputer with mask ROM and a one-chip microcomputer with EPROM, wherein a plurality of photomasks for photomechanical process and/or photomask data can be used in common. According to this method, because of the common use of the photomasks and/or photomask data, it becomes able to make uniform the layout, size and electric characteristic of chips.

1 Claim, 6 Drawing Sheets

WITH EPROM
(WITH E²PROM)

WITH MASK ROM

ONE-CHIP MICROCOMPUTER MANUFACTURING METHOD

This is a continuation of application Ser. No. 07/585,539, filed Sep. 20, 1990, now abandoned.

BACKGROUND OF THE INVENTION

1. Field of the Invention

This invention relates to a method of manufacturing a one-chip microcomputer with ROM mounted therein.

2. Description of Related Art

In general, there are two types of ROMs mounted in a one-chip microcomputer, namely, a mask ROM for which informations to be stored are decided in the manufacturing process by using photomask, and an EPROM or E²PROM allowing electrical writing of informations after the manufacture. Although the mask ROM is advantageous from the viewpoint of manufacturing cost in a mass production, it takes a long time to complete a sample after the informations to be stored are decided, that is, turnaround time is lengthy. Moreover, the photomask costs too much in a small quantity of production. Meanwhile, informations can be written into the EPROM or E²PROM after the manufacturing process, so that the turnaround time is remarkably shortened, contributing to a reduction of manufacturing cost in a small quantity of production. On the other hand, however, the manufacturing process of a wafer becomes complicated thereby to raise the manufacturing cost of the EPROM or E²PROM as a whole, and therefore the EPROM or E²PROM is disadvantageous if in a mass production.

As noted above, the mask ROM and EPROM or E²PROM have their own merits and demerits. Therefore, a plurality of kinds of chips with mask ROM, EPROM E²PROM, etc. have been developed in recent years for microcomputers.

For a ROM mounted in a one-chip microcomputer with mask ROM, for example, a depletion type ROM, contact type ROM, OR type ROM through ion implantation or the like is used. The line decoder, string decoder and sense amplifier which have circuits and characteristics corresponding to the kind of the using ROM are used. On the other hand, for a ROM mounted in a one-chip microcomputer with EPROM or E²PROM, an OR type ROM is generally used, and the line decoder, string decoder and sense amplifier are of the type corresponding to this OR type ROM. Besides, the one-chip microcomputer with EPROM or E²PROM requires particularly a writing circuit and a controlling circuit, etc.

It is natural that the one-chip microcomputer with mask ROM and that with EPROM or E²PROM are different from each other in layout and size, whereby the photomask should be fabricated individually for each chip, bringing about such problems as an elongated time required for development and cost therefor. Furthermore, although it is necessary that the former microcomputer with mask ROM and the latter microcomputer with EPROM or E²PROM have the same electric characteristics from the sense of compatibility, it is difficult to make the electric characteristics equal to each other when the layout and size of the chips are not the same.

FIG. 1 shows the layout of a conventional one-chip microcomputer with EPROM, and FIG. 2 shows the layout of a conventional one-chip microcomputer with mask ROM. Referring to FIGS. 1 and 2, numerals 1 and 11 represent a memory array region, 2 and 12 representing a line decoder region, and 3 and 13 representing a region including a string decoder and a sense amplifier, respectively. It is clear from these FIGS. 1 and 2 that the layout and size of the one-chip microcomputer with mask ROM are different from those of the one-chip microcomputer with EPROM. This goes true also between the one-chip microcomputer with mask ROM and a one-chip microcomputer with E²PROM.

SUMMARY OF THE INVENTION

One object of this invention is to provide a one-chip microcomputer manufacturing method whereby the developing time and cost of any type of one-chip microcomputers with EPROM, E²PROM or mask ROM mounted therein can be reduced remarkably.

A further object of this invention is to provide a one-chip microcomputer manufacturing method whereby the layout and size and also electric characteristics of a chip in any type of one-chip microcomputers with EPROM, E²PROM or mask ROM can be made uniform.

A still further object of this invention is to provide a one-chip microcomputer manufacturing method which can enhance compatibility between the one-chip microcomputer with EPROM or E²PROM and the one-chip microcomputer with mask ROM.

According to the one-chip microcomputer manufacturing method of this invention, a plurality of photomasks and/or photomasks data are used in common when the one-chip microcomputer with mask ROM and the one-chip microcomputer with EPROM or E²PROM are manufactured, so that the layout, size and electric characteristics of the chips can be made uniform.

The above and further objects and features of this invention will more fully be apparent from the following detailed description with accompanying drawings.

DESCRIPTION OF THE PREFERRED EMBODIMENTS

This invention will be discussed more in detail hereinbelow taken in conjunction with preferred embodiments thereof with reference to the accompanying drawings. It is to be noted here that although the following description is related to a one-chip microcomputer with EPROM, it applies substantially the same also in the case of a one-chip microcomputer with E²PROM.

Figure 1:
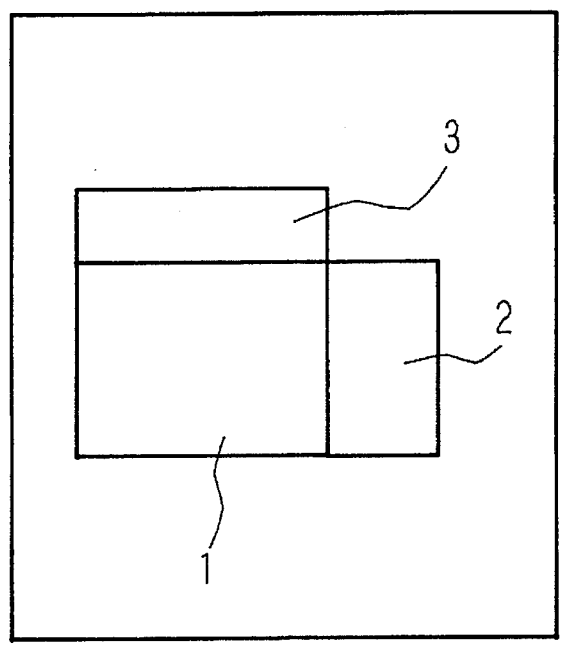
FIG. 1 is a layout diagram of a conventional one-chip microcomputer with EPROM.
Figure 2:
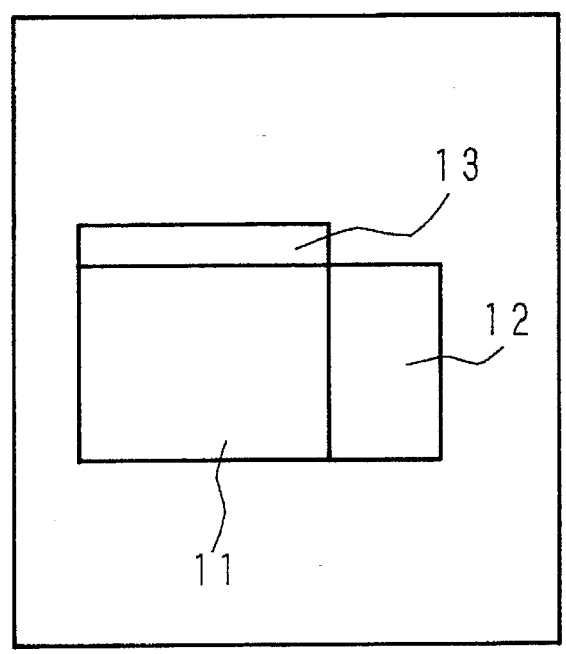
FIG. 2 is a layout diagram of a conventional one-chip microcomputer with mask ROM.
Figure 3A:
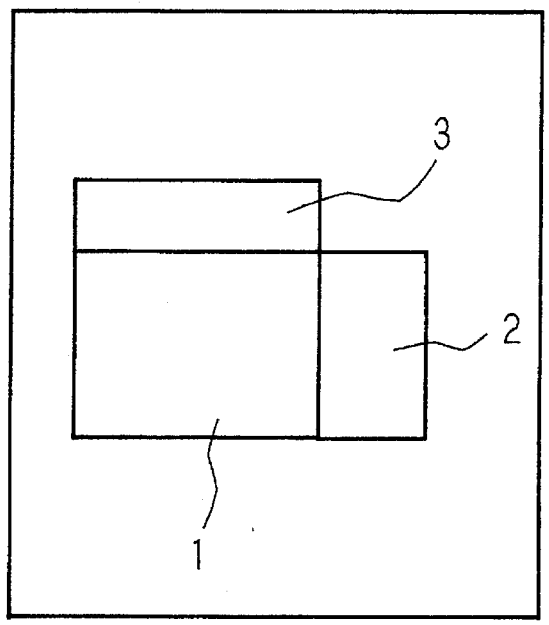
FIG. 3(a) is a layout diagram of a one-chip microcomputer with mask EPROM which is manufactured by the method according to this invention.
Figure 3B:
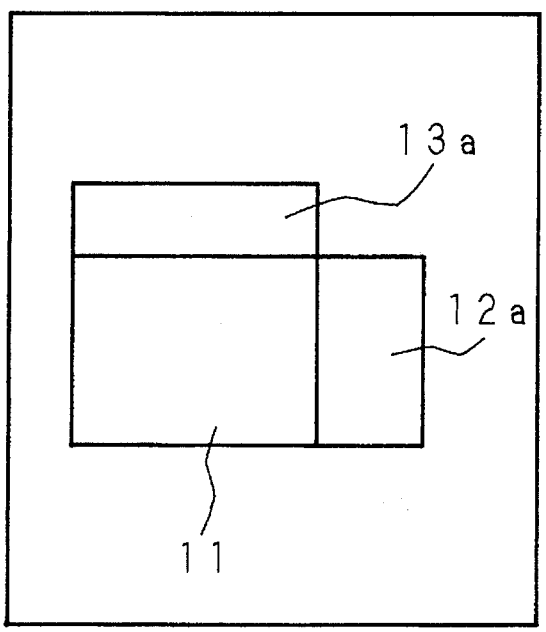
FIG. 3(b) is a layout diagram of a one-chip microcomputer with mask ROM which is manufactured by the method according to this invention.
Figure 4A:
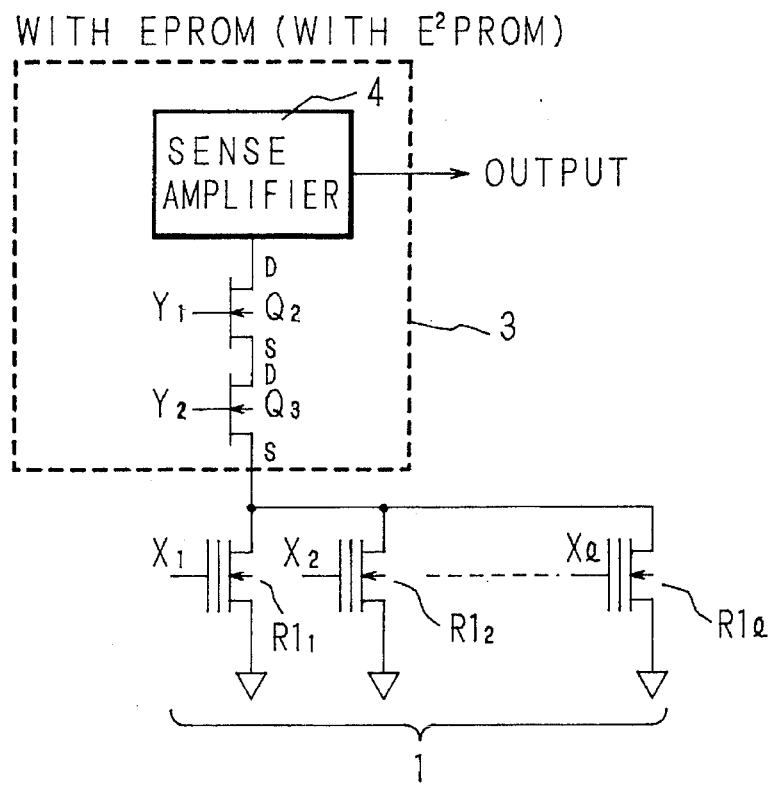
FIG. 4(a) is a partial circuit diagram of the one-chip microcomputer with EPROM (or E²PROM) which is manufactured by the method according to this invention.
Figure 4B:
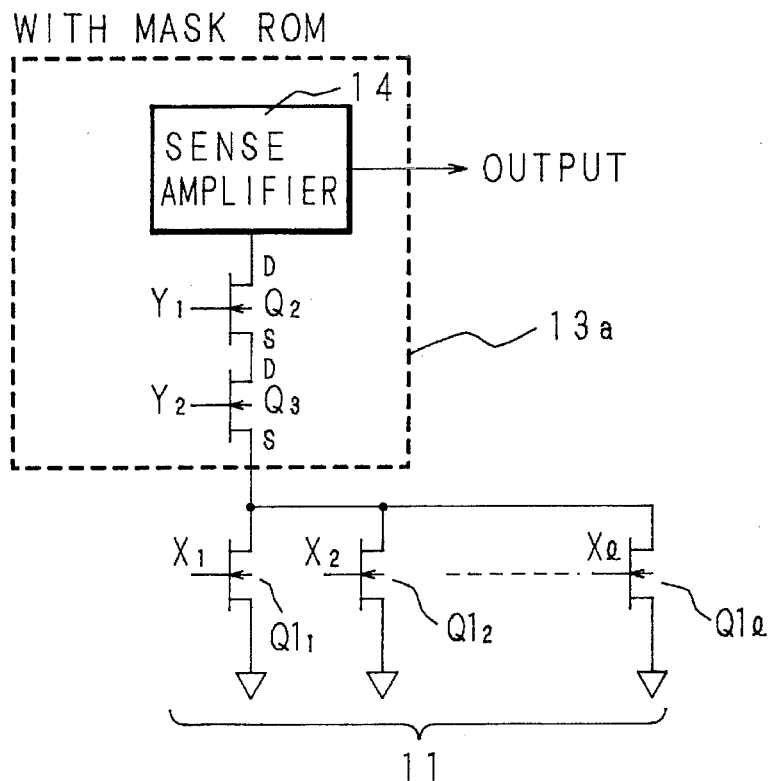
FIG. 4(b) is a partial circuit diagram of the one-chip microcomputer with mask ROM which is manufactured by the method according to this invention.

In FIG. 3(a), there indicated is the layout of a one-chip microcomputer with EPROM which is manufactured according to the method of this invention. FIG. 3(b) illustrates the layout of a one-chip microcomputer with mask ROM manufactured by the method of this invention. In FIGS. 3(a) and 3(b), numerals 1 and 11 designate a memory array region, with 2 and 12a showing a line decoder region, 3 and 13a showing a region of a string decoder and a sense amplifier. The one-chip microcomputer with EPROM is manufactured in the same manner as in the conventional method. On the other hand, the mask ROM to be mounted in the one-chip microcomputer with mask ROM is agreed in type or model with, for example, an OR type ROM which is generally employed in the one-chip microcomputer with EPROM. Moreover, the layout and size of the chip of the one-chip microcomputer with mask ROM are agreed with those of the one-chip microcomputer with EPROM while the circuit structures of both types are basically made the same as shown in FIGS. 4(a) and 4(b). The photomask for photomechanical process and/or photomask data (CAD data or the like) employed in manufacture of the one-chip microcomputer with EPROM are used in common, with partial exception, in manufacture of the one-chip microcomputer with mask ROM.

In FIGS. 4(a) and 4(b), $Q_2$ and $Q_3$ designate respectively an N channel transistor for selecting bit lines. Gates of the N channel transistors $Q_2$ and $Q_3$ are connected to respective line decoder output signal lines $Y_1$ and $Y_2$. A drain D of each N channel transistor $Q_2$ is connected to a sense amplifier 4 or 14, while a source S thereof is connected to a drain D of each N channel transistor $Q_3$ Moreover, a source S of each transistor $Q_3$ is connected to a memory cell transistor in the memory array region 1 or 11.

The memory array region 1 in the one-chip microcomputer with EPROM is, as indicated in FIG. 4(a), consisted of EPROM memory cell transistors $R1_1$–$R1_l$ in the floating gate structure. The memory cell transistors $R1_1$–$R1_l$ have their gates connected respectively to line decoder output signal lines $X_1$–$X_l$, with their drains connected to the same bit line. In the meantime, as illustrated in FIG. 4(b), the memory array region 11 in the one-chip microcomputer with mask ROM is consisted of N-channel memory cell transistors $Q1_1$–$Q1_l$ which have their gates connected respectively to line decoder output signal lines $X_1$–$X_l$ and their drains connected to the same bit line.

Both the layout and the size in the circuit structures shown in FIGS. 4(a) and 4(b) are made substantially the same. Accordingly, the photomask and photomask data can be used in common in manufacture of the one-chip microcomputer with EPROM and that with mask ROM except in some process.

Figure 5:
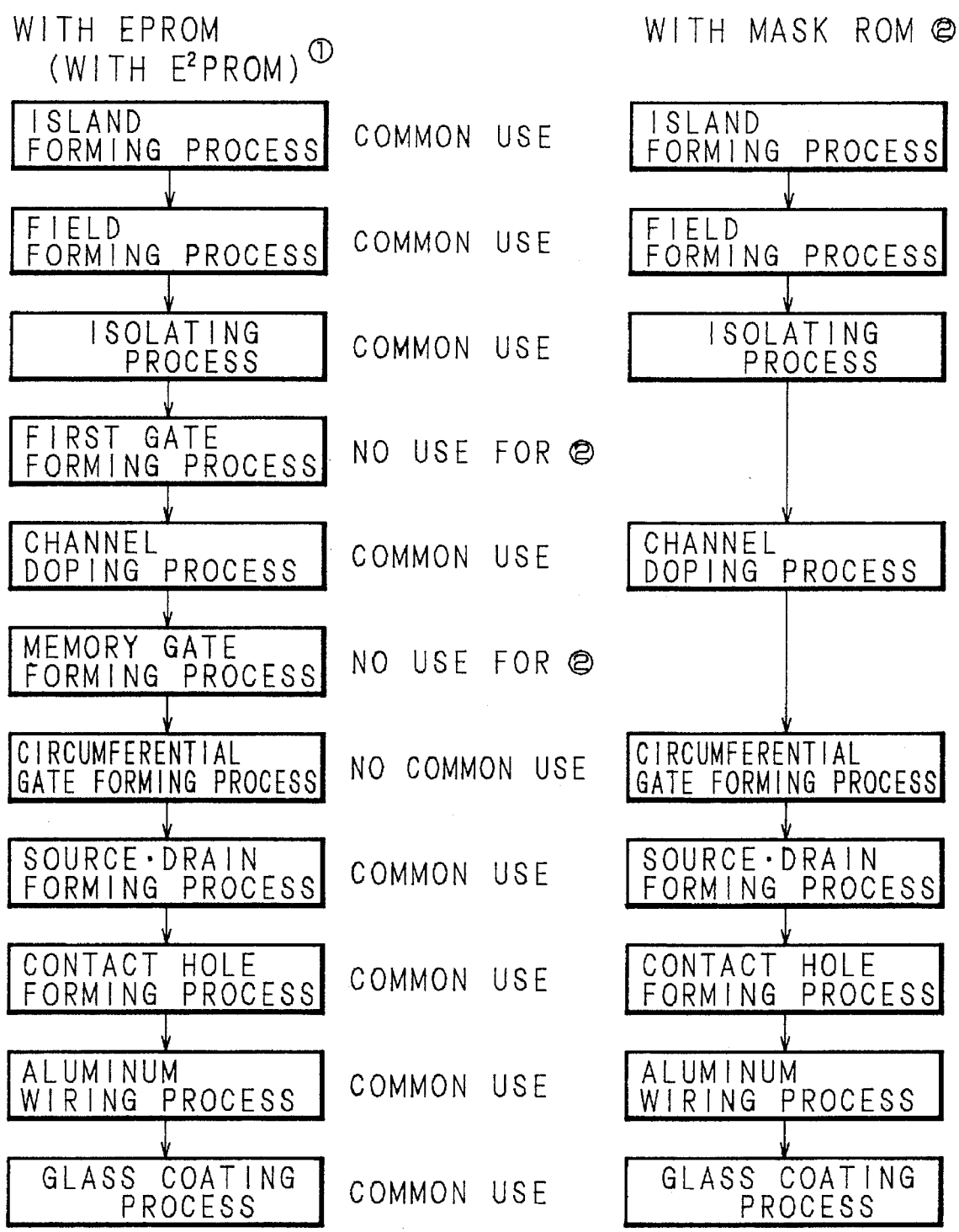
FIG. 5 is a flow-chart showing the manufacturing process of this invention.

As is understood from the flow-chart of FIG. 5 showing the manufacturing process of the one-chip microcomputer with EPROM and that with mask ROM, the photomask and photomask data can be used in common, specifically, in the island forming process, field forming process, isolating process, channel doping process, source drain forming process, contact hole forming process, aluminum wiring process and glass coating process. However, the photomask used in the first gate forming process and memory gate forming process for the one-chip microcomputer with EPROM is not used in manufacture of the one-chip microcomputer with mask ROM. At the same time, in the circumferential gate forming process, different photomasks are necessitated individually for the one-chip microcomputer with EPROM and that with mask ROM.

It is needless to say that the above manufacturing process is discussed merely by way of example, and accordingly the photomask and photomask data which can be used in common will differ if the other kind of manufacturing process is employed.

In consequence to the above manufacturing process, circuits peculiar to the one-chip microcomputer with EPROM, e.g., writing circuit, controlling circuit, etc. are formed also in the one-chip microcomputer with mask ROM. However, these circuits are never used in the one-chip microcomputer with mask ROM, and moreover even the presence of these circuits does not disturb the other circuits of the one-chip microcomputer with mask ROM. Therefore, it is not inconvenient that the one-chip microcomputer with mask ROM is provided with these circuits peculiar to the one-chip microcomputer EPROM.

Figure 6:
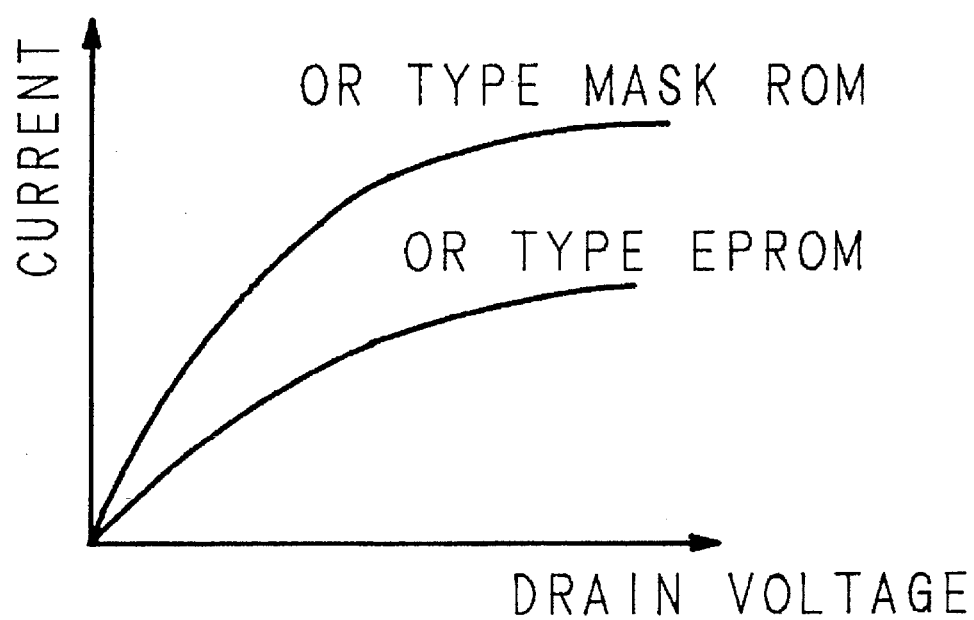
FIG. 6 is a graph showing characteristics of a memory cell transistor of an OR type EPROM and a memory cell transistor of an OR type mask ROM.

FIG. 6 shows the current-voltage characteristics of the memory cell transistor of the OR type EPROM and that of the OR type mask ROM, wherein an axis of abscissa represents a drain voltage and an axis of ordinate represents a current. The memory cell transistor of the OR type EPROM is equipped with a floating gate in the double-layered structure of polysilicone. Therefore, as is clear from this graph of FIG. 6, if the channel length and channel width of the memory cell transistor of the OR type EPROM are equal to those of the memory cell transistor of the OR type mask ROM, the current value of the former becomes smaller than that of the latter.

As such, in order to gain the equivalent electric characteristic for ROM when mounted in the one-chip microcomputer, the characteristic of the sense amplifier should be changed. Concretely, the characteristic of the sense amplifier is changed only by adjusting the shape of the transistor geometrically, for example, by adjusting the area of a gate of the transistor used for detection of the memory cell current in the sense amplifier.

Figure 7:
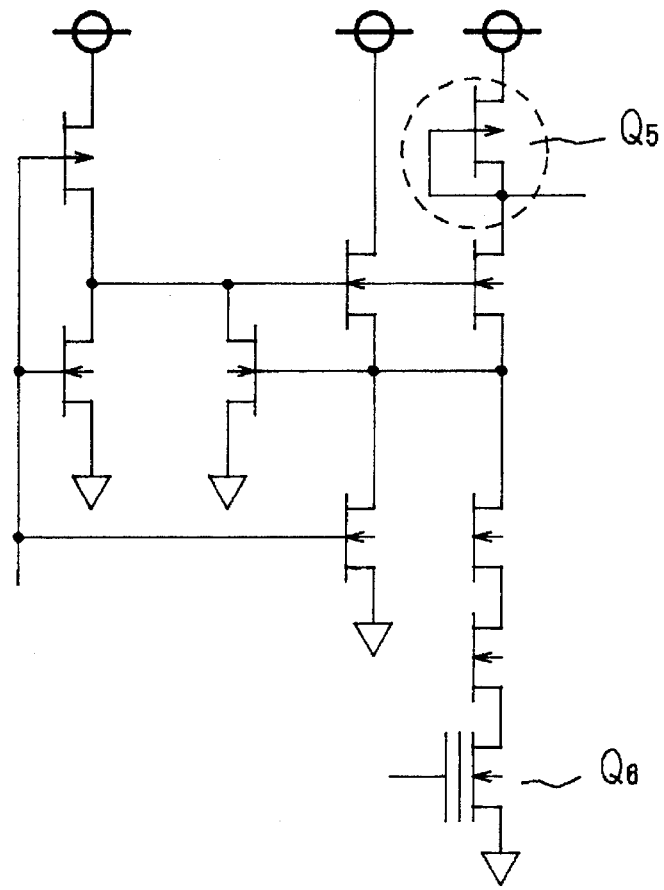
FIG. 7 is a partial circuit diagram of a sense amplifier.
Figure 8A:
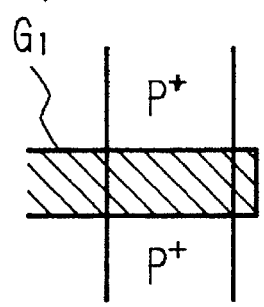
FIG. 8(a) is a diagrammatic plane view showing a part of a transistor of the sense amplifier of the one-chip microcomputer with EPROM (or E²PROM)
Figure 8B:
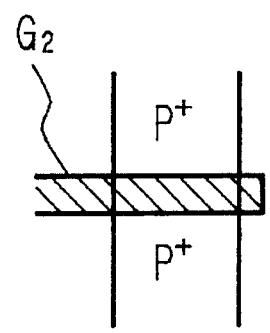
FIG. 8(b) is a diagrammatic plane view showing a part of a transistor of the sense amplifier of the one-chip microcomputer with mask ROM.

FIG. 7 is a partial circuit diagram of the sense amplifier 4 or 14. The gate of a transistor $Q_5$ which is used to detect whether the current is large or small is changed as indicated in FIG. 8. The current changes in accordance with the presence or absence of storage of electric charge at the floating gate of a memory cell transistor $Q_6$ in the floating gate structure. FIG. 8(a) shows a part of the transistor $Q_5$ used to detect the current in the sense amplifier 4 of the one-chip micro, computer with EPROM, while FIG. 8(b) indicates a part of the the transistor $Q_5$, similar to the transistor of FIG. 8(a), in the sense amplifier 14 of the one-chip microcomputer with mask ROM. The area of the gate overlapping with a $P^+$ layer constituting the drain region and source region is different between FIGS. 8(a) and 8(b). Specifically, the area of a gate $G_1$ in the one-chip microcomputer with EPROM is large as shown in FIG. 8(a), whereas the area of a gate $G_2$ of the one-chip microcomputer with mask ROM is reduced as indicated in FIG. 8(b). As a result of this, the difference in the characteristic of the memory cell transistors indicated in FIG. 6 can be removed.

Changing the characteristic in the above-described manner is one example, and the current characteristic of the sense amplifier of each one-chip microcomputer or the transistor and the number thereof to be changed in accordance with the manufacturing process should be naturally determined in a suitable manner.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A method of manufacturing a mask ROM, said method comprising the steps of:

producing EPROM structures on a first semiconductor substrate using a set of EPROM-specific photomasks, said set of EPROM-specific photomasks including an EPROM-specific channel doping mask and wherein said EPROM structures include EPROM-specific memory cells using transistors having a first current-voltage characteristic and including a corresponding EPROM cell sense amplifier coupled to said EPROM-specific memory cells, said corresponding EPROM cell sense amplifier adapted for operation with said EPROM-specific memory cells; and thereafter forming islands, forming field regions, and isolating a plurality of areas on a second semiconductor substrate by employing a first subset of said set of EPROM-specific photomasks to produce mask ROM-specific memory cells using transistors having a second current-voltage characteristic different from said first current-voltage characteristic and producing a corresponding mask ROM cell sense amplifier coupled to said mask ROM-specific memory cells wherein said corresponding mask ROM cell sense amplifier includes a current detecting transistor adapted for operation with said EPROM-specific memory cells;

doping a channel in a plurality of regions of said second semiconductor substrate by employing said EPROM-specific channel doping mask; and forming a circumferential gate area and adjusting a geometry of a gate of said current detecting transistor by use of a mask ROM-specific photomask to achieve a particular electrical current-voltage characteristic for said corresponding mask ROM cell sense amplifier adapted for operation with said mask ROM-specific memory cells; and forming sources and drains, forming contact holes, forming aluminum interconnections, and forming glass coating by employing a second subset of said set of EPROM-specific photomasks.

* * * * *